(12) United States Patent
Chen et al.

(10) Patent No.: US 9,746,534 B2
(45) Date of Patent: Aug. 29, 2017

(54) ADAPTER, COIL, AND MAGNETIC RESONANCE IMAGING SYSTEM

(71) Applicants: Yan Hong Chen, Shenzhen (CN); Wen Ming Li, Shenzhen (CN); Jia Heng Tan, Shenzhen (CN); Tong Tong, Shenzhen (CN)

(72) Inventors: Yan Hong Chen, Shenzhen (CN); Wen Ming Li, Shenzhen (CN); Jia Heng Tan, Shenzhen (CN); Tong Tong, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 760 days.

(21) Appl. No.: 14/135,229

(22) Filed: Dec. 19, 2013

(65) Prior Publication Data

US 2014/0176137 A1 Jun. 26, 2014

(30) Foreign Application Priority Data

Dec. 20, 2012 (CN) .......................... 2012 1 0555182

(51) Int. Cl.
*G01R 33/36* (2006.01)
*G01R 33/54* (2006.01)

(52) U.S. Cl.
CPC ................................ *G01R 33/3664* (2013.01)

(58) Field of Classification Search
CPC .................................... H01P 1/15; A61B 6/56
USPC ........................ 333/101, 103–107; 378/114
See application file for complete search history.

(56) References Cited

U.S. PATENT DOCUMENTS

| 5,327,017 | A | * | 7/1994 | Fischer | H03K 17/76 327/194 |
| 6,144,205 | A | | 11/2000 | Souza et al. | |
| 7,511,592 | B2 | * | 3/2009 | Inoue | H03K 17/76 333/104 |
| 7,898,359 | B2 | * | 3/2011 | Darriet | H03K 17/74 333/101 |
| 2005/0156598 | A1 | | 7/2005 | Matschl et al. | |
| 2009/0174498 | A1 | | 7/2009 | Xing et al. | |
| 2010/0052683 | A1 | | 3/2010 | Huber | |

(Continued)

FOREIGN PATENT DOCUMENTS

| CN | 1891151 A | 1/2007 |
| CN | 101478067 A | 7/2009 |

(Continued)

OTHER PUBLICATIONS

Chinese office Action for related Chinese Application No. 201210555182.X dated Dec. 7, 2015.

(Continued)

*Primary Examiner* — Dean Takaoka
(74) *Attorney, Agent, or Firm* — Lempia Summerfield Katz LLC

(57) ABSTRACT

An adapter includes a control circuit, a control signal interface, a first input signal interface, a second input signal interface, and a first output signal interface. The control signal interface receives a tuning/detuning signal, and the control circuit switches, according to the tuning/detuning signal, the first input signal interface and the second input signal interface to be in conduction with the first output signal interface.

13 Claims, 3 Drawing Sheets

(56) References Cited

U.S. PATENT DOCUMENTS

2011/0316540 A1    12/2011  Price
2015/0112184 A1*   4/2015  Li ..................... G01R 33/3664
                                                                600/410

FOREIGN PATENT DOCUMENTS

CN       101869478 A    10/2010
JP       2007275164 A   10/2007

OTHER PUBLICATIONS

Korean Office Action for corresponding Korean application No. 10-2013-0158509, Jun. 23, 2015.

* cited by examiner

ADAPTER, COIL, AND MAGNETIC RESONANCE IMAGING SYSTEM

This application claims the benefit of CN 201210555182.X, filed on Dec. 20, 2012, which is hereby incorporated by reference in its entirety.

TECHNICAL FIELD

The present embodiments relate to the technical field of magnetic resonance imaging.

BACKGROUND

Magnetic resonance imaging (MRI) is a technology for imaging by use of magnetic resonance. Magnetic resonance includes that an atomic nucleus with an odd number of protons (e.g., a hydrogen atomic nucleus, which widely exists in the human body), the protons have spinning motion, like a small magnet, and the spin axes of these small magnets do not have a certain orientation. If an external magnetic field is applied, these small magnets are rearranged according to the magnetic force lines of the external magnetic field, and, more specifically, arranged in two directions that are parallel or antiparallel to the magnetic force lines of the external magnetic field. The above-mentioned direction parallel to the magnetic force lines of the external magnetic field is called a positive longitudinal axis, and the above-mentioned direction antiparallel to the magnetic force lines of the external magnetic field is called a negative longitudinal axis. The atomic nuclei only have a longitudinal magnetization component, and the longitudinal magnetization component has both direction and amplitude. Atomic nuclei in the external magnetic field are excited by a radio-frequency (RF) pulse with a specific frequency to make the spin axes of these atomic nuclei deviate from the positive longitudinal axis or the negative longitudinal axis to produce resonance. This is magnetic resonance. After the spin axes of the above-mentioned excited atomic nuclei deviate from the positive longitudinal axis or the negative longitudinal axis, the atomic nuclei will have a transverse magnetization component. After the radio-frequency pulse transmission has been stopped, the excited atomic nuclei transmit an echo signal and gradually release the absorbed energy in the form of electromagnetic waves, with the phase and energy level thereof both restoring to the state before being excited. An image may be reconstructed after the echo signal transmitted by the atomic nuclei is further processed by, for example, spatial encoding.

In the prior art, the magnetic resonance imaging system may operate with a number of various radio-frequency (RF) antennas (e.g., coils). The radio-frequency antennas are used for transmitting and receiving radio-frequency pulses so as to excite the atomic nuclei to radiate magnetic resonance signals and/or for acquiring the induced magnetic resonance signals. A magnetic resonance imaging (MRI) system includes various coils, such as a body coil covering the whole body area, a receiving coil only covering a certain part of the body and so on. The magnetic resonance system may have a large integrated coil (e.g., body coil) that is permanently fixed in a magnetic resonance scanner. The integrated coil may be arranged in a cylindrical manner surrounding a patient acquisition cavity (e.g., using a structure referred to as a birdcage structure), and in the patient acquisition cavity, a patient is supported on a bed (e.g., a patient positioning table) during measurement. Since the coverage area of the body coil is relatively large, a higher transmitting power is needed, and the signal-to-noise ratio of an obtained image is relatively low. The signal-to-noise ratio throughout the image is non-uniform as well. With respect to the body coil, the coverage area of a local coil is relatively small (e.g., the knee area covered by a knee coil, the head covered by a head coil, a wrist covered by a wrist coil), so the local coil receives only radio-frequency signals within a limited radio-frequency excitation range (in order to distinguish from the radio-frequency signals in the transmission stage, the radio-frequency signals received by the coil are hereinafter referred to as magnetic resonance signals). The signal-to-noise ratio of an obtained image is thus relatively high, and the signal-to-noise ratio throughout the image is relatively uniform.

The local coil is externally attached to the magnetic resonance imaging system. For existing magnetic resonance imaging systems, one interface may only support one local coil, and the number of interfaces configured by an early magnetic resonance system is relatively small. For an advanced application such as a later whole body image sweeping that uses a plurality of local coils simultaneously, this number of interfaces is apparently not enough. In order to make the magnetic resonance imaging system compatible with multiple local coils, a common practice is to increase the number of interfaces or to use control bus technology to send an upper-layer command to a decoder, so that the decoder controls a corresponding radio-frequency switch to switch according to the content of the command. The defects of the above method are the increase of costs of the magnetic resonance imaging system, and the original magnetic resonance imaging system that does not have enough interfaces will not be easily upgraded to a plurality of interfaces. The method that uses the control bus modifies software. The magnetic resonance imaging system has corresponding control lines and may introduce a clock signal that easily causes interference to the magnetic resonance imaging system.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an adapter that enables a magnetic resonance imaging system to increase the number of radio-frequency channels under the condition of not changing any hardware is provided. One interface is compatible with a plurality of coils. Without defining a complex communication protocol, the switching of the input signals of each coil may be realized by using the tuning/detuning signal currently possessed by an interface of the magnetic resonance imaging system.

The adapter provided by one or more of the present embodiments includes a control circuit, a control signal interface, a first input signal interface, a second input signal interface, and a first output signal interface. The control signal interface receives a tuning/detuning signal, and the control circuit switches, according to the tuning/detuning signal, the input signal interface and the second input signal interface to be in conduction with the first output signal interface.

In an implementation of one or more of the present embodiments, the adapter further includes a second output signal interface. The control circuit switches, according to the tuning/detuning signal, the first input signal interface and the second input signal interface to be in conduction with the first output signal interface and the second output signal interface.

In an implementation of one or more of the present embodiments, the control circuit includes a first diode, a second diode, a third diode, and a fourth diode. Cathodes of the first diode and the second diode are connected to the first input signal interface, and anodes of the third diode and the fourth diode are connected to the second input signal interface. An anode of the first diode and a cathode of the fourth diode are connected to the second output signal interface, and an anode of the second diode and a cathode of the third diode are connected to the control signal interface and the first output signal interface.

In an implementation of one or more of the present embodiments, the second output signal interface is grounded.

In an implementation of one or more of the present embodiments, the first diode, the second diode, the third diode, and the fourth diode are respectively connected in parallel with a protection circuit.

In an implementation of one or more of the present embodiments, the protection circuit includes a resistor and an inductor connected in series.

In an implementation of one or more of the present embodiments, the control circuit includes a first diode, a second diode, a third diode, a fourth diode, a fifth diode, and a sixth diode. Anodes of the first diode and the second diode are connected to the control signal interface. A cathode of the first diode, a cathode of the third diode and the first input signal interface are connected to an anode of the sixth diode. A cathode of the second diode, a cathode of the fourth diode and the second input signal interface are connected to an anode of the fifth diode. An anode of the third diode and a cathode of the fifth diode are connected to the first output signal interface. An anode of the fourth diode and a cathode of the sixth diode are connected to the second output signal interface.

The magnetic resonance imaging system provided by the embodiments includes any one of the above-mentioned adapters.

The coil provided by the embodiments includes any one of the above-mentioned adapters.

The magnetic resonance imaging system provided by the embodiments includes any one of the above-mentioned coils.

The embodiments enable the magnetic resonance imaging system to increase the number of radio-frequency channels under the condition of not changing any hardware, and one interface is compatible with a plurality of coils. Without defining a complicated communication protocol, the switching of the input signals of each coil may be realized by using the tuning/detuning signal currently possessed by an interface of the magnetic resonance imaging system itself, thereby substantially reducing the system structure and the replacement costs.

DETAILED DESCRIPTION

An adapter is provided. A tuning/detuning signal of a magnetic resonance imaging system is applied to control a radio-frequency switch. The adapter is controlled, via the radio-frequency switch, to realize accessing a plurality of coils to one connector simultaneously. The radio-frequency output of each coil of the plurality of coils, which are connected in a cascading manner, is switched via a switch, and the radio-frequency outputs are output to the system, so that the function of a multi-channel system may be realized on a system that has limited channels. Due to the use of an existing tuning/detuning signal, only the radio-frequency switch is to be integrated into the adapter or coil without any alterations to the original magnetic resonance imaging system.

Embodiment I

Figure 1:
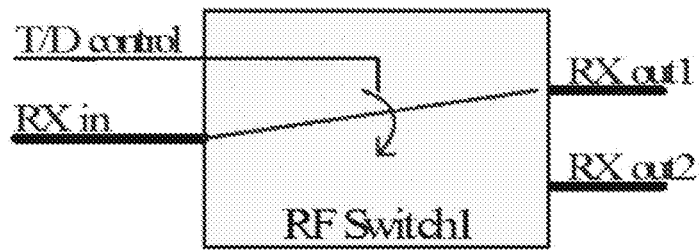
FIG. 1 is an adapter according to one embodiment.

FIG. 1 is an adapter according to one embodiment. The adapter uses a tuning/detuning signal of the magnetic resonance imaging system to perform the switching of a radio-frequency switch. As shown in FIG. 1, the adapter includes a control circuit RF_Switch1, a control signal interface T/D_control, a first input signal interface RX_in1, a second input signal interface RX_in2, a first output signal interface RX_out1, and a second output signal interface GND. The control signal interface T/D_control receives a tuning/detuning signal, and the control circuit RF_Switch1 switches, according to the tuning/detuning signal, the first input signal interface RX_in1 and the second input signal interface RX_in2 to be in conduction with the first output signal interface RX_out1.

Specific to the magnetic resonance imaging system, the adapter includes a radio-frequency signal output interface and two radio-frequency signal input interfaces. The radio-frequency signal output interface selects one of the two radio-frequency signal input interfaces through the tuning/detuning signal. When one of the radio-frequency signal input interfaces connects to the radio-frequency signal output interface, the other radio-frequency signal input interface connects to a 50Ω resistor and is then grounded.

Figure 2:
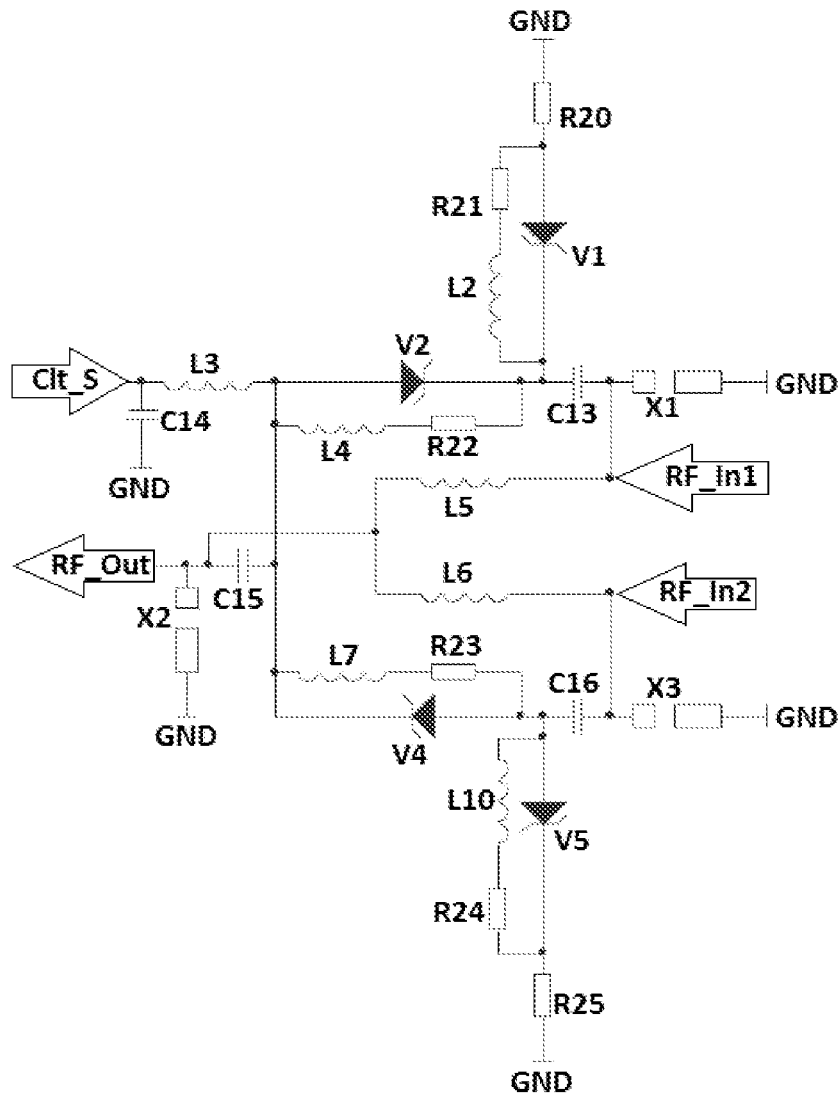
FIG. 2 is a circuit diagram of one embodiment of a control circuit of an adapter according to FIG. 1.

FIG. 2 is a circuit diagram of one embodiment of a control circuit of the adapter. As shown in FIG. 2, the control circuit RF_Switch1 includes a first diode V1, a second diode V2, a third diode V4, and a fourth diode V5. Cathodes of the first diode V1 and the second diode V2 are connected to the first input signal interface RX_in1. Anodes of the third diode V4 and the fourth diode V5 are connected to the second input signal interface RX_in2. An anode of the first diode V1 and a cathode of the fourth diode V5 are connected to the second output signal interface GND and then grounded. An anode of the second diode V2, a cathode of the third diode V4 and the control signal interface Clt_S are connected to the first output signal interface RX_out1.

The second output signal interface GND is grounded, but the second output signal interface GND may also be connected to other components of the magnetic resonance imaging system so as to provide a corresponding output signal. The first diode V1, the second diode V2, the third diode V4, and the fourth diode V5 are respectively connected in parallel with a protection circuit. The protection circuit includes a resistor and an inductor connected in series.

From the perspective of operating principles, as shown in FIG. 2, if the tuning/detuning control signal Clt_S is in the state of 100 mA, then the second diode V2 and the fourth diode V5 are in conduction, and the first diode V1 and the third diode V4 are cut off. A magnetic resonance signal is thus allowed to be transmitted through the first input signal interface RF_In1 to the first output signal interface RF_out and be output. At the same time, the second input signal interface RF_In2 is allowed to be shorted out to 50 ohm through the fourth diode V5 in conduction. If the tuning/detuning control signal Clt_S is in the state of −30V, then the second diode V2 and the fourth diode V5 are cut off, and the first diode V1 and the third diode V4 are cut off. The magnetic resonance signal is thus allowed to be transmitted through the second input signal interface RF_In2 to the first output signal interface RF_out and allowed to be output. At the same time, the first input signal interface RF_In1 is allowed to be shorted out to 50 ohm through the first diode V1 in conduction.

Embodiment II

Figure 3:
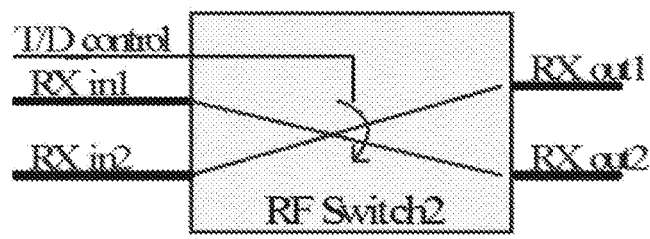
FIG. 3 is an adapter according to another embodiment.

FIG. 3 is an adapter according to another embodiment. The adapter uses a tuning/detuning signal of the magnetic resonance imaging system to perform the switching of a radio-frequency switch. As shown in FIG. 3, the adapter includes a control circuit RF_Switch2, a control signal interface T/D_control, a first input signal interface RX_in1, a second input signal interface RX_in2, a first output signal interface RX_out1, and a second output signal interface RX_out2. The control signal interface T/D_control receives a tuning/detuning signal, and the control circuit RF_Switch1 switches, according to the tuning/detuning signal, the first input signal interface RX_in1 and the second input signal interface RX_in2 to be in conduction with the output signal interface RX_out1 and the second output signal interface RX_out2.

Specific to the magnetic resonance imaging system, the adapter includes two radio-frequency signal output interfaces and two radio-frequency signal input interfaces. The two radio-frequency signal output interfaces select the two radio-frequency signal input interfaces through the tuning/detuning signal. When one of the radio-frequency signal input interfaces connects to one of the radio-frequency signal output interfaces, the other radio-frequency signal input interface connects to the other radio-frequency signal output interface.

Figure 4:
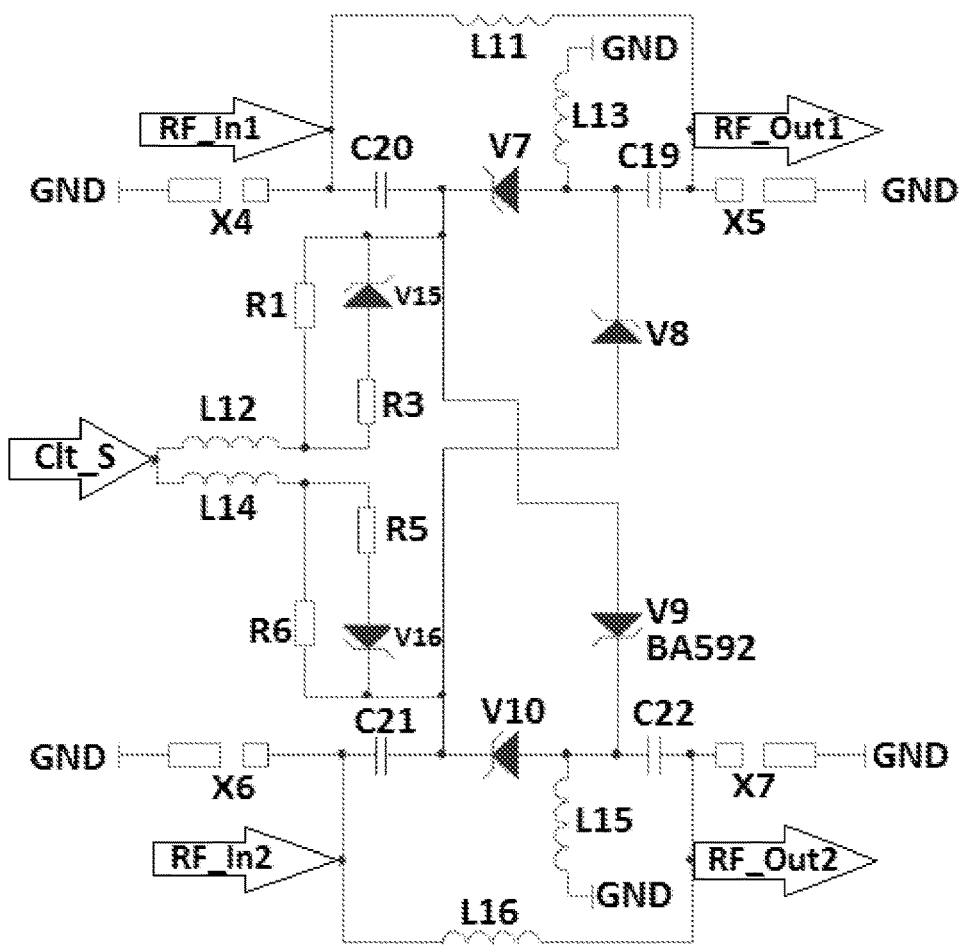
FIG. 4 is a circuit diagram of one embodiment of a control circuit of an adapter according to FIG. 3.

FIG. 4 is a circuit diagram of one embodiment of a control circuit of an adapter. As shown in FIG. 4, the control circuit RF_Switch2 includes a first diode V15, a second diode V16, a third diode V7, a fourth diode V10, a fifth diode V8, and a sixth diode V9. Anodes of the first diode V15 and the second diode V16 are connected to the control signal interface Clt_S. A cathode of the first diode V15, a cathode of the third diode V7 and the first input signal interface RX_in1 are connected to an anode of the sixth diode V9. A cathode of the second diode V16, a cathode of the fourth diode V10 and the second input signal interface RX_in2 are connected to an anode of the fifth diode V8. An anode of the third diode V7 and a cathode of the fifth diode V8 are connected to the first output signal interface RX_out1, and an anode of the fourth diode V10 and a cathode of the sixth diode V9 are connected to the second output signal interface RX_out2.

From the perspective of operating principles, as shown in FIG. 4, if the tuning/detuning signal Clt_S is in the state of 100 mA, then diodes V16, V8, V15 and V9 are in conduction, and diodes V7 and V10 are cut off. The magnetic resonance signal is thus allowed to be transmitted through the first input signal interface RX_in1 to the second output signal interface Rx_out2 and is allowed to be output. At the same time, the signal of the second input signal interface RX_in2 is allowed to be output through the first output signal interface RX_out1. If the tuning/detuning control signal Clt_S is in the state of −30 V, then diodes V7 and V10 are in conduction, and diodes V16, V8, V15 and V9 are cut off. The magnetic resonance signal is thus allowed to be transmitted through the first input signal interface RX_in1 to the first output signal interface RX_out1 and is allowed to be output. At the same time, the signal of the second input signal interface RX_in2 is allowed to be output through the second output signal interface RX_out2.

One or more of the present embodiments enable the magnetic resonance imaging system to increase the number of radio-frequency channels under the condition of not changing any hardware, and one interface is compatible with a plurality of coils. Without defining a complicated communication protocol, the switching of the input signals of each coil may be realized by using the tuning/detuning signal currently possessed by an interface of the magnetic resonance imaging system, thereby substantially reducing the system structure and the replacement costs.

Figure 5:
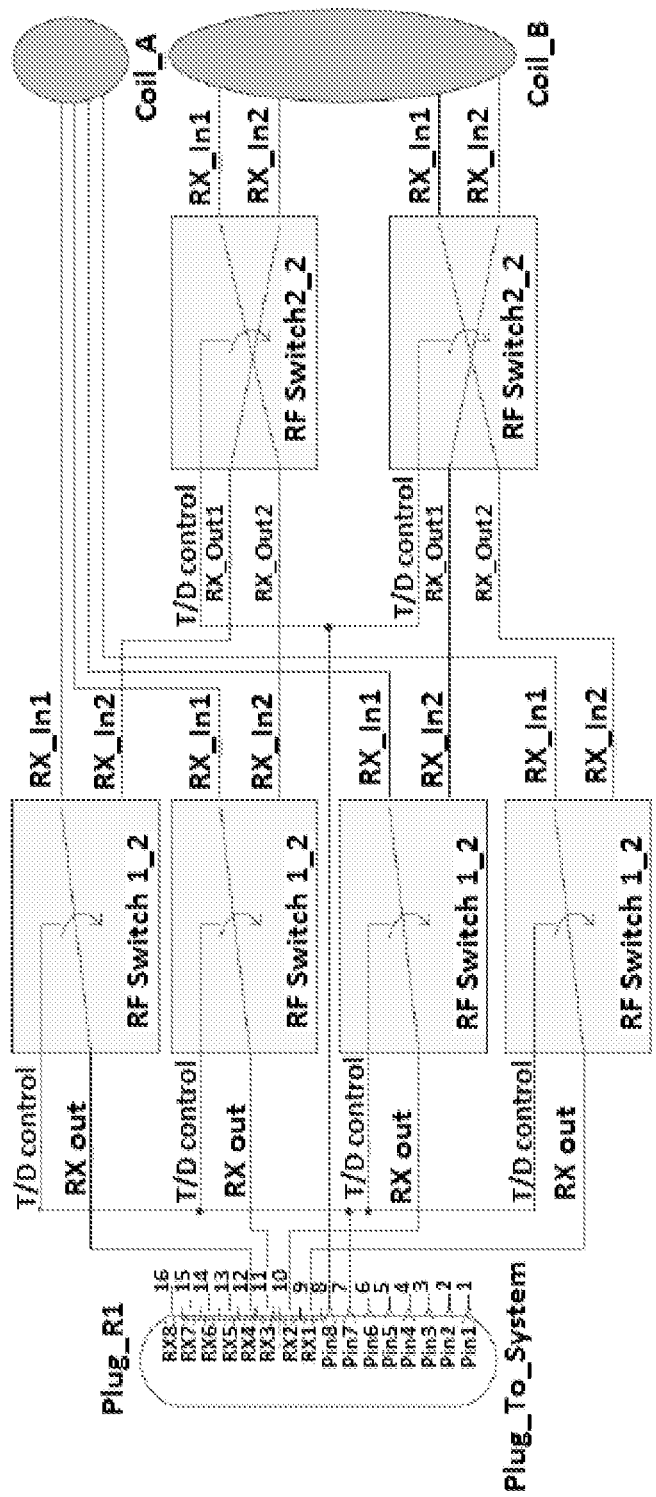
FIG. 5 is an adapter for a magnetic resonance imaging system according to an embodiment.

FIG. 5 is a schematic diagram of one embodiment of an adapter for a magnetic resonance imaging system. When a first coil Coil_A and a second coil Coil_B are plugged into the interface Plug_R1 of the magnetic resonance imaging system simultaneously, if the magnetic resonance imaging system scans and applies the first coil Coil_A, a first adapter RF switch1_2 controls, according to the tuning/detuning signal, the magnetic resonance signal to be input from the first input signal interface RX_in1. The selection and application of the first coil Coil_A is thus realized. If the magnetic resonance imaging system applies a second coil Coil_B, the tuning/detuning signal switches the state, so as to make the first adapter RF switch1_2 control, according to the tuning/detuning signal, the magnetic resonance signal to be input from the second input signal interface RX_in2. The selection and application of the second coil Coil_B is thus realized. The function of the second adapter RF switch2_2 is to solve the application of the coils (e.g., body matrix coils) that have the problem of directivity (e.g., inputting different input signals into different output interfaces to obtain different data). The second adapter RF switch2_2 may automatically switch the output interface where the input signal is input, so as to avoid manual switching.

What are described above are merely embodiments of the present invention and are not intended to limit the protection scope of the present invention. During specific implementation, an appropriate improvement may be performed according to embodiments of the present invention, so as to adapt the specific requirements of specific situations. Therefore, it may be understood that the embodiments of the present invention as described herein are just used as demonstration, and are not intended to limit the protection scope of the present invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An adapter comprising:
a control circuit;
a control signal interface;
a first input signal interface configured to interface with a first magnetic resonance coil;
a second input signal interface configured to interface with a second magnetic resonance coil; and
a first output signal interface configured to interface with a magnetic resonance imaging system,
wherein the control signal interface is configured to receive a tuning/detuning signal of the magnetic resonance imaging system, and
wherein the control circuit is configured to switch, according to the tuning/detuning signal, the first input signal interface and the second input signal interface to be in conduction with the first output signal interface.

2. The adapter of claim 1, further comprising a second output signal interface,
wherein the control circuit is configured to switch, according to the tuning/detuning signal, the first input signal interface and the second input signal interface to be in conduction with the first output signal interface and the second output signal interface.

3. The adapter of claim 2, wherein the second output signal interface is grounded.

4. The adapter of claim 2, wherein the control circuit comprises a first diode, a second diode, a third diode, and a fourth diode,
wherein cathodes of the first diode and the second diode are connected to the first input signal interface, anodes of the third diode and the fourth diode are connected to the second input signal interface, an anode of the first diode and a cathode of the fourth diode are connected to the second output signal interface, and an anode of the second diode and a cathode of the third diode are connected to the control signal interface and the first output signal interface.

5. The adapter of claim 4, wherein the first diode, the second diode, the third diode, and the fourth diode are respectively connected in parallel with a protection circuit.

6. The adapter of claim 5, wherein the protection circuit comprises a resistor and an inductor connected in series.

7. The adapter of claim 2, wherein the control circuit comprises a first diode, a second diode, a third diode, a fourth diode, a fifth diode, and a sixth diode,
wherein anodes of the first diode and the second diode are connected to the control signal interface, a cathode of the first diode, a cathode of the third diode and the first input signal interface are connected to an anode of the sixth diode, a cathode of the second diode, a cathode of the fourth diode and the second input signal interface are connected to an anode of the fifth diode, an anode of the third diode and a cathode of the fifth diode are connected to the first output signal interface, and an anode of the fourth diode and a cathode of the sixth diode are connected to the second output signal interface.

8. A magnetic resonance imaging system comprising:
an adapter comprising:
a control circuit having a first diode, a second diode, a third diode, a fourth diode, a fifth diode, and a sixth diode;
a control signal interface;
a first input signal interface;
a second input signal interface;
a first output signal interface; and
a second output signal interface,
wherein the control signal interface is configured to receive a tuning/detuning signal,
wherein the control circuit is configured to switch, according to the tuning/detuning signal, the first input signal interface and the second input signal interface to be in conduction with the first output signal interface and the second output signal interface,
wherein anodes of the first diode and the second diode are connected to the control signal interface,
wherein a cathode of the first diode, a cathode of the third diode, and the first input signal interface are connected to an anode of the sixth diode,
wherein a cathode of the second diode, a cathode of the fourth diode, and the second input signal interface are connected to an anode of the fifth diode,
wherein an anode of the third diode and a cathode of the fifth diode are connected to the first output signal interface, and
wherein an anode of the fourth diode and a cathode of the sixth diode are connected to the second output signal interface.

9. The magnetic resonance imaging system of claim 8, wherein the second output signal interface is grounded.

10. A coil for a magnetic resonance imaging system, the coil comprising:
an adapter comprising:
a control circuit;
a control signal interface;
a first input signal interface configured to interface with a first magnetic resonance coil;
a second input signal interface configured to interface with a second magnetic resonance coil; and
a first output signal interface configured to interface with a magnetic resonance imaging system,
wherein the control signal interface is configured to receive a tuning/detuning signal of the magnetic resonance imaging system, and
wherein the control circuit is configured to switch, according to the tuning/detuning signal, the first input signal interface and the second input signal interface to be in conduction with the first output signal interface.

11. The coil of claim 10, wherein the adapter further comprises:
a second output signal interface,
wherein the control circuit is configured to switch, according to the tuning/detuning signal, the first input signal interface and the second input signal interface to be in conduction with the first output signal interface and the second output signal interface.

12. The coil of claim 11, wherein the control circuit comprises a first diode, a second diode, a third diode, and a fourth diode,
wherein cathodes of the first diode and the second diode are connected to the first input signal interface, anodes of the third diode and the fourth diode are connected to the second input signal interface, an anode of the first diode and a cathode of the fourth diode are connected to the second output signal interface, and an anode of the second diode and a cathode of the third diode are connected to the control signal interface and the first output signal interface.

13. A magnetic resonance imaging system comprising:
a coil comprising:
    an adapter comprising:
        a control circuit having a first diode, a second diode, a third diode, a fourth diode, a fifth diode, and a sixth diode;
        a control signal interface;
        a first input signal interface;
        a second input signal interface;
        a first output signal interface; and
        a second output signal interface,
wherein the control signal interface is configured to receive a tuning/detuning signal,
wherein the control circuit is configured to switch, according to the tuning/detuning signal, the first input signal interface and the second input signal interface to be in conduction with the first output signal interface and the second output signal interface,
wherein anodes of the first diode and the second diode are connected to the control signal interface,
wherein a cathode of the first diode, a cathode of the third diode, and the first input signal interface are connected to an anode of the sixth diode,
wherein a cathode of the second diode, a cathode of the fourth diode, and the second input signal interface are connected to an anode of the fifth diode,
wherein an anode of the third diode and a cathode of the fifth diode are connected to the first output signal interface, and
wherein an anode of the fourth diode and a cathode of the sixth diode are connected to the second output signal interface.

* * * * *